United States Patent [19]
Kuo et al.

[11] Patent Number: 5,995,415
[45] Date of Patent: Nov. 30, 1999

[54] SIMULTANEOUS OPERATION FLASH MEMORY DEVICE WITH A FLEXIBLE BANK PARTITION ARCHITECTURE

[75] Inventors: Tiao-Hua Kuo, San Jose; Yasushi Kasa, Cupertino; Nancy Leong, Sunnyvale; Johnny Chen, Cupertino; Michael Van Buskirk, Saratoga, all of Calif.

[73] Assignees: Advanced Micro Devices, Inc., Sunnyvale, Calif.; Fujitsu Limited, Kanagawa-Ken, Japan

[21] Appl. No.: 09/159,142

[22] Filed: Sep. 23, 1998

[51] Int. Cl.[6] ................................................. G11C 7/00
[52] U.S. Cl. ............................ 365/185.11; 365/185.13; 365/230.03
[58] Field of Search ...................... 365/185.11, 185.13, 365/230.03, 63

[56] References Cited

U.S. PATENT DOCUMENTS

| | | | |
|---|---|---|---|
| 5,822,238 | 10/1998 | Okubo | 365/230.03 |
| 5,847,998 | 12/1998 | Van Buskirk | 365/185.33 |
| 5,848,012 | 12/1998 | Tsukude et al. | 365/230.03 |
| 5,867,430 | 2/1999 | Chen et al. | 365/189.04 |

*Primary Examiner*—Vu A. Le
*Attorney, Agent, or Firm*—Fliesler, Dubb, Meyer & Lovejoy

[57] ABSTRACT

A simultaneous operation non-volatile memory device with a flexible bank partition architecture comprises a memory array 20 including a plurality of memory cells arranged in a plurality of columns and rows, a plurality of bit lines 28 and 30 each coupled to a respective column of the memory cells, each of the bit lines comprising first and second bit line segments separated by a gap designating a memory partition boundary between upper and lower memory banks, and an X-decoder 22 coupled to the respective rows of the memory cells to row decode the memory array in response to receiving upper and lower bank memory addresses. Two pre-decoders 24 and 26 are coupled to the X-decoder 22. Two Y-decoders 32 and 34 are coupled to the bit line segments to provide column decoding for the memory cells in the upper and lower memory banks, respectively.

58 Claims, 6 Drawing Sheets

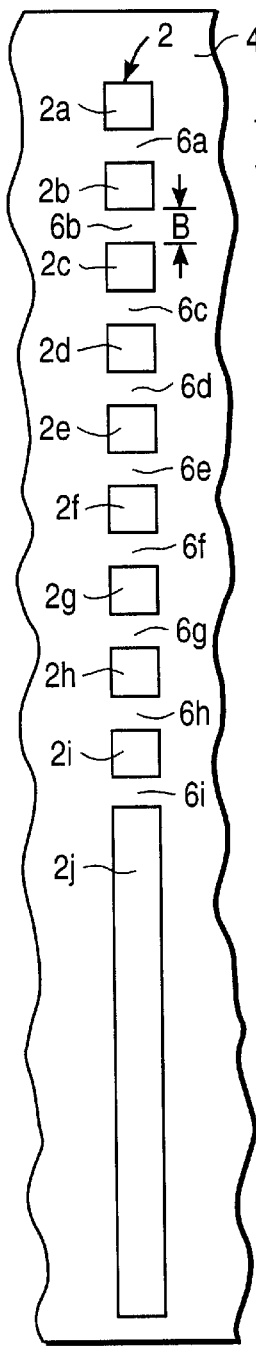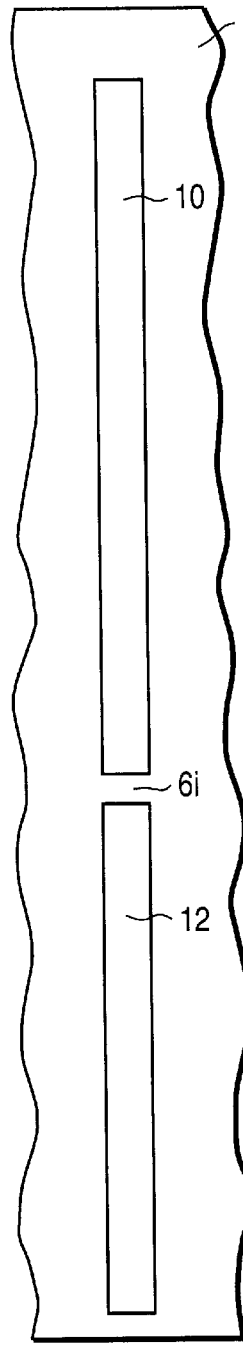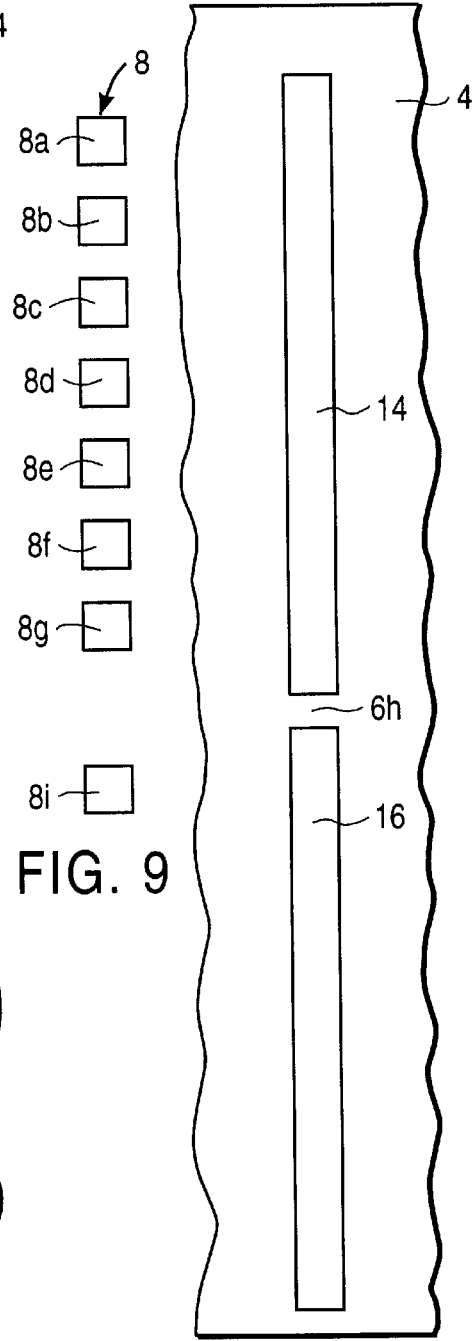
FIG. 6  FIG. 7  FIG. 8  FIG. 9  FIG. 10

SIMULTANEOUS OPERATION FLASH MEMORY DEVICE WITH A FLEXIBLE BANK PARTITION ARCHITECTURE

TECHNICAL FIELD

The present invention relates to a flash memory device, and more particularly, to a simultaneous operation flash memory device with a flexible bank partition architecture.

BACKGROUND ART

Non-volatile memory devices have been developed by the semiconductor integrated circuit industry for various applications such as computers and digital communications. A conventional non-simultaneous operation flash memory device typically includes a single fixed memory bank. A conventional simultaneous operation flash memory device typically includes two fixed memory banks each comprising a fixed number of sectors of memory cells. Each sector of memory cells has a fixed amount of memory storage, for example, 0.5 megabytes (MB) of memory and consists of a fixed number of pages of memory cells, for example, sixteen pages of memory cells. A page is typically defined as one word of memory stored in the memory cells on a single word line.

In a conventional simultaneous operation flash memory device, such as a conventional simultaneous operation NOR flash memory array, the memory cells are divided into an upper memory bank and a lower memory bank. The upper and lower memory banks each have a predetermined fixed size of memory storage. The upper and lower memory banks are typically used for different functions in simultaneous reading and writing operations. For example, the lower memory bank may be used for code storage, whereas the upper memory bank may be used for data storage.

Since the upper and lower memory bank partitions are fixed in conventional simultaneous operation flash memory devices, different flash memory devices with different integrated circuit designs are required for different memory partitions. Therefore, in order to customize the memory circuit for a variety of applications which require different partitions of the upper and lower memory banks for code and data storage, a different circuit design would be required for each of the fixed upper and lower memory bank partitions in a conventional simultaneous operation flash memory device.

Because the size of memory storage in each of the upper and lower memory banks is not variable in a conventional simultaneous operation non-volatile memory device, a single circuit design may be suitable for only one of several different applications in which different partitions of the upper and lower memory banks are required. In order to produce simultaneous operation flash memory devices with different partitions of the upper and lower memory banks, a different circuit design and a different set of associated masks are required for each of the devices.

A disadvantage of having to design a different integrated circuit and a full set of different masks for each of the simultaneous operation flash memory devices with different upper and lower memory bank partitions is that the design, fabrication and testing processes can be very costly and time-consuming. Therefore, there is a need for a simultaneous operation flash memory device with a flexible bank partition architecture. Furthermore, there is a need for a simplified decoding architecture for the simultaneous operation flash memory device with a flexible bank partition architecture.

DISCLOSURE OF THE INVENTION

The present invention satisfies these needs. In accordance with the present invention, a simultaneous operation non-volatile memory device with a flexible bank partition architecture generally comprises:

(a) a memory array comprising a plurality of memory cells arranged in a plurality of rows and columns;

(b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries; and (c) an X-decoder coupled to the respective rows of the memory cells and capable of receiving upper and lower bank memory addresses.

In an embodiment, the simultaneous operation flash memory device with a flexible bank partition architecture according to the present invention further comprises two Y-decoders coupled to the first and second bit line segments for the upper and lower memory banks, respectively. In a further embodiment, the simultaneous operation flash memory device with a flexible bank partition architecture according to the present invention further comprises a pre-decoder, coupled to the X-decoder, comprising a plurality of flexibly partitioned conductive lines, each of the conductive lines comprising first and second conductive line segments separated by a gap designating the selected memory partition boundary. The first conductive line segments are capable of receiving the lower bank memory address and the second conductive line segments are capable of receiving the upper bank memory address.

Furthermore, the flexibly partitioned conductive lines in the pre-decoder may be fabricated from a metal layer having a plurality of predetermined memory boundary options corresponding to the predetermined partition boundaries, each of the memory boundary options capable of forming the gap which separates the first and second conductive line segments. The first and second conductive line segments in the pre-decoder may be formed by electrically connecting the memory boundary options along each of the flexibly partitioned conductive lines but leaving one of the memory boundary options open, in order to form the gap between the first and second conductive line segments. In this embodiment, the X-decoder is a fixed X-decoder which performs the function of row decoding the rows of memory cells in both upper and lower memory banks.

In an alternate embodiment, the X-decoder comprises a plurality of flexibly partitioned conductive lines, each of the conductive lines comprising first and second conductive line segments separated by a gap designating the memory partition boundary. Furthermore, the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments. The first and second conductive line segments in the X-decoder may be formed by electrically connecting the memory boundary options along each of the flexibly partitioned conductive lines but leaving one of the memory boundary options open, in order to form the gap between the first and second conductive line segments.

In yet a further embodiment, the simultaneous operation flash memory device with a flexible bank partition architecture according to the present invention further comprises first and second predecoders coupled to the first and second conductive line segments in the X-decoder, respectively. The first pre-decoder is capable of receiving the lower bank memory address and the second pre-decoder is capable of receiving the upper bank memory address. In yet an additional embodiment, the bit lines connected to the respective columns of memory cells in the memory array are fabricated from a metal layer such as an M2 metal layer having a plurality of predetermined memory boundary options corresponding to the predetermined partition boundaries, each of the memory boundary options capable of forming the gap which separates the upper memory bank from the lower memory bank. Furthermore, the first and second bit line segments in the memory array may be formed by electrically connecting the memory boundary options along each of the bit lines but leaving one of the memory boundary options open, in order to form the gap between the first and second bit line segments.

In yet another embodiment, the simultaneous operation non-volatile memory device with a flexible bank partition architecture according to the present invention comprises a memory array, an X-decoder having a plurality of flexibly partitioned conductive lines, and at least one pre-decoder having a plurality of flexibly partitioned conductive lines. The flexibly partitioned conductive lines in both the X-decoder and the pre-decoder each have a respective gap designating the selected memory partition boundary. In a further embodiment, two pre-decoders with flexibly partitioned conductive line segments are provided in the memory device according to the present invention. The first pre-decoder is coupled to the first conductive line segments in the X-decoder for the row decoding of the upper memory bank, and the second pre-decoder is coupled to the second conductive line segments in the X-decoder for the row decoding of the lower memory bank.

Advantageously, the present invention provides a simultaneous operation non-volatile memory device with a flexible bank partition architecture. A further advantage of the present invention is that it allows flexible partitioning of a simultaneous operation flash memory device into upper and lower memory banks with a memory partition boundary selected from a plurality of predetermined partition boundaries by simply selecting the gaps which define the selected boundary between the upper and lower memory banks in the bit lines in the memory array and in the conductive lines in the associated decoding circuits. Yet a further advantage of the present invention is that it obviates the need for designing completely different circuits and completely different sets of masks for fabricating simultaneous operation flash memory devices in which different memory partition boundaries are desired. Furthermore, only one X-decoder is required for the row decoding of all memory cells in both upper and lower memory banks in the memory array.

DESCRIPTION OF THE DRAWINGS

The present invention will be described with respect to particular embodiments thereof, and references will be made to the drawings in which:

FIG. 6 shows a simplified plan view of a basic metal layer with a plurality of gaps separating the basic metal layer into a plurality of basic metal layer segments;

FIG. 7 shows a simplified plan view of a plurality of metal option layer segments before they are provided on the basic metal layer as shown in FIG. 6;

FIG. 8 shows a simplified plan view of metal layer after the metal option layer segments as shown in FIG. 7 are provided on the basic metal layer as shown in FIG. 6;

FIG. 9 shows a simplified plan view of another pattern of metal option layer segments before they are provided on the basic metal layer as shown in FIG. 6; and FIG. 10 shows a simplified plan view of a basic metal layer after the metal option layer segments as shown in FIG. 9 are provided on the basic metal layer as shown in FIG. 6.

MODES FOR CARRYING OUT THE INVENTION

Figure 1:
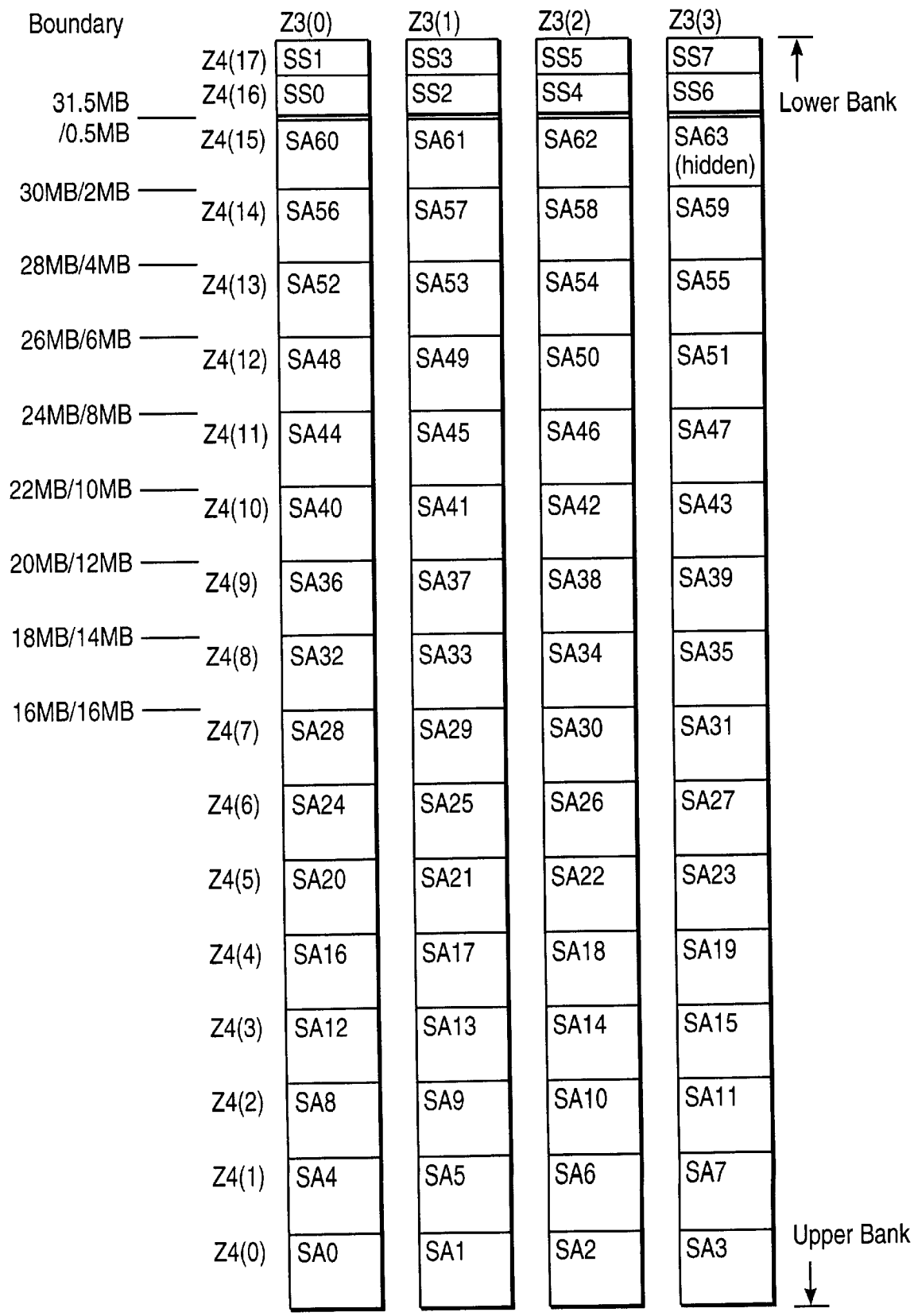
FIG. 1 is a diagram showing an embodiment of a simultaneous operation flash memory device comprising a plurality of blocks of memory cells with a plurality of flexibly partitioned boundary lines that are capable of partitioning the memory boundary into an upper memory bank and a lower memory bank.

FIG. 1 shows a simplified diagram of a simultaneous operation non-volatile memory device, for example, a NOR flash memory device which includes a plurality of sectors of memory cells indicated by blocks SA0, SA1, SA2, . . . SA63. The memory sectors SA0, SA1, SA2, . . . SA63 are arranged in a plurality of rows and columns, with each row containing four sectors. The rows of the memory sectors are numbered consecutively from Z4(0) to Z4(15). The NOR flash memory device as shown in FIG. 1 further includes memory sectors SS0, SS1, SS2, . . . SS7 arranged in rows Z4(16) to Z4(17).

In the example shown in FIG. 1, each sector of the memory cells SA0, SA1, SA2, . . . SA63 includes 0.5 megabytes (MB) of memory, and each row of the memory sectors Z4(0), Z4(1), Z4(2), . . . Z4(15) includes 2 MB of memory. The last memory sector SA63 is optional and may be regarded as a hidden memory sector. The total memory capacity of the memory sectors SS0, SS1, SS2, . . . SS7 is on the order of about 0.5 MB. The 0.5 MB of memory in the sectors SS0, SS1, SS2, . . . SS7 may be regarded as a predetermined minimum lower bank memory required for code storage. FIG. 1 also shows a plurality of memory partition boundary lines, each of which is capable of bisecting the memory into an upper memory bank and a lower memory bank. An example of some possible partitions of a 32 MB simultaneous operation flash memory device with a flexible bank partition architecture according to the present invention is illustrated in FIG. 1, with the number before the slash denoting the amount of memory in the upper memory bank and the number after the slash denoting the amount of memory in the lower memory bank. The memory partition boundary can be set between any adjacent rows of memory sectors, with each adjacent boundary change resulting in either an increment or a decrement of 2 MB in the upper and lower memory banks if each memory sector contains 0.5 MB of memory and each row contains 4 memory sectors.

The arrangement of the blocks of memory cells in a simultaneous operation flash memory device as shown in FIG. 1 is merely an illustrative example of many different possible memory partitions in a simultaneous operation flash memory device with a flexible bank partition architecture according to the present invention. However, the present invention is not limited to the memory partition boundaries as illustrated in FIG. 1; other memory partition boundaries are also feasible. For example, where as FIG. 1 shows the memory partition boundaries which yield a minimum of 16 MB and a maximum of 31.5 MB of memory in the upper memory bank and a minimum of 0.5 MB and a maximum of 16 MB of memory in the lower memory bank, other memory partition boundaries can be set which give the upper bank less than 16 MB of memory and the lower bank more than 16 MB of memory. For example, flexible memory partition boundaries can also be set between the rows Z4(0) and Z4(1), between Z4(1) and Z4(2), and so on.

Figure 2:
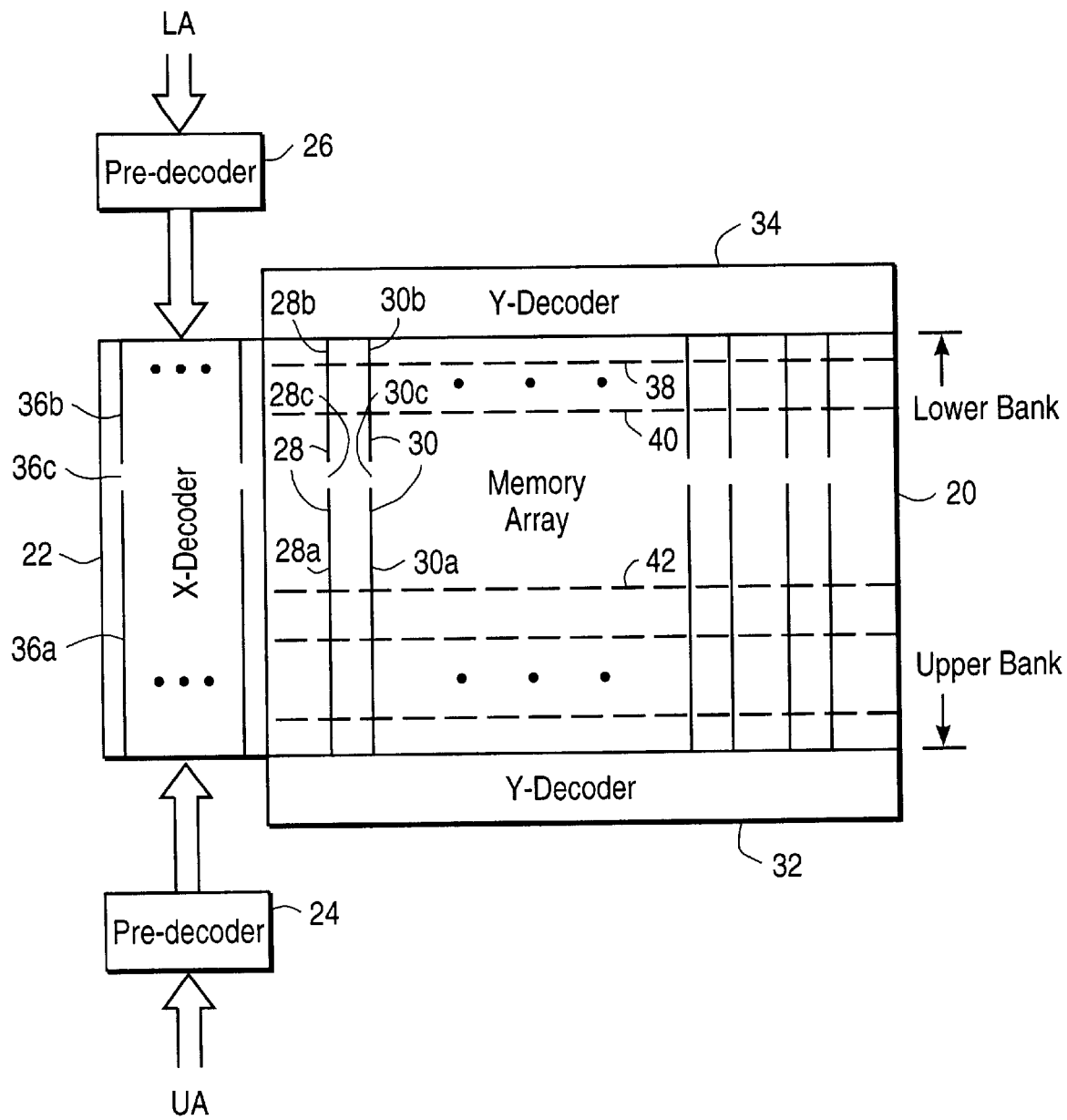
FIG. 2 is a block diagram showing an embodiment of the simultaneous operation flash memory device with a flexible bank partition architecture in accordance with the present invention.

FIG. 2 is a block diagram showing an embodiment of the simultaneous operation flash memory device with a flexible bank partition architecture in accordance with the present invention. As shown in FIG. 2, the simultaneous operation flash memory device comprises a memory array 20, an X-decoder 22 coupled to the memory array 20, and two pre-decoders 24 and 26 coupled to the X-decoder 22. The pre-decoders 24 and 26 are coupled to receive upper and lower bank memory addresses denoted as UA and LA, respectively. The memory array 20, which comprises a plurality of memory cells arranged in a plurality of rows and columns, includes a plurality of flexibly partitioned bit lines such as bit lines 28 and 30 connected to the respective columns of memory cells.

The bit lines in the memory array 20 each comprise a first bit line segment connected to the respective column of memory cells assigned to the upper memory bank and a second bit line segment connected to the respective column of memory cells assigned to the lower memory bank. For example, as shown in FIG. 2, the bit line 28 comprises first and second bit line segments 28a and 28b, while the bit line 30 comprises first and second bit line segments 30a and 30b. The bit line 28 has a gap 28c between the first and second bit line segments 28a and 28b, and similarly, the bit line 30 has a gap 30c between the first and second bit line segments 30a and 30b. The gaps 28c and 30c as well as gaps in the other bit lines in the memory array 20 serve as a memory partition boundary between the lower and upper memory banks.

In an embodiment, the simultaneous operation flash memory device with the flexible bank partition architecture according to the present invention further comprises first and second Y-decoders 32 and 34 coupled to the memory array 20. The first Y-decoder 32 is coupled to the first bit line segments including the bit line segments 28a and 30a for the upper memory bank, whereas the second Y-decoder 34 is coupled to the second bit line segments including the bit line segments 28b and 30b for the lower memory bank. The first Y-decoder 32 is coupled to the bit line segments for the upper memory bank in the memory array for the column decoding of the memory cells along the respective bit lines in the upper memory bank. Similarly, the second Y-decoder 34 is coupled to the bit line segments in the lower memory bank for the column decoding of the memory cells disposed along the respective bit line segments in the lower memory bank. Because the columns of memory cells in the memory array 20 are physically separated by the gaps between the first and second bit line segments in the simultaneous operation flash memory device with flexible bank partition architecture according to the present invention, two Y-decoders 32 and 34 are provided for the separate column decoding of the memory cells in the upper and lower memory banks, respectively.

Furthermore, in the embodiment shown in FIG. 2, the X-decoder 22 also has a flexible bank partition architecture which comprises a plurality of flexibly partitioned conductive line segments such as segments 36a and 36b separated by a gap 36c which defines the memory partition boundary between the upper and lower memory banks in the X-decoder 22. For example, the first conductive line segments including the segment 36a may be implemented for the row decoding of the respective rows of memory cells in the upper memory bank, whereas the second conductive line segments including the segment 36b may be implemented for the row decoding of the respective rows of memory cells in the lower memory bank. Furthermore, the gaps between the conductive line segments for the row decoding of the upper and lower memory banks correspond to the memory partition boundary which is defined by the gaps between the bit line segments for the upper and lower memory banks in the memory array 20.

The X-decoder 22 is coupled to the word lines which are shown as horizontal dashed lines such as dashed lines 38, 40 and 42 in the memory array 20. Each of the word lines is connected to a respective row of memory cells in the memory array 20. The first conductive line segments including the conductive line segment 36a in the X-decoder 22 are coupled to the word lines including the word line 42 in the upper memory bank for the row decoding of the respective rows of memory cells in the upper memory bank. The second conductive line segments including the conductive line segment 36b in the X-decoder 22 are coupled to the word lines including word line 40 in the lower memory bank in the memory array 20 for the row decoding of the respective rows of memory cells in the lower memory bank.

The pre-decoders 24 and 26 are coupled to the first and second conductive line segments in the X-decoder 22, respectively, to provide upper and lower bank memory address decoding bits to the respective first and second conductive line segments such as segments 36a and 36b in the X-decoder 22 for row decoding the upper and lower memory banks. In the embodiment shown in FIG. 2, the first pre-decoder 24 is coupled to receive only the upper bank memory address bits denoted as UA and is capable of generating upper bank address pre-decoding signals for the X-decoder 22 to row decode the respective word lines in the upper memory bank. In a similar manner, the second pre-decoder 26 is coupled to receive only the lower bank memory address bits denoted as LA and is capable of transmitting lower bank address pre-decoding signals to the second conductive line segments in the X-decoder 22 to row decode the respective word lines in the lower memory bank. The flexibly partitioned bit lines in the memory array 20 as well as the flexibly partitioned conductive lines in the X-decoder 22 may be fabricated by overlapping a mask pattern for basic metal layer segments with a mask pattern for metal option layer segments which will be described in further detail below.

Figure 3:
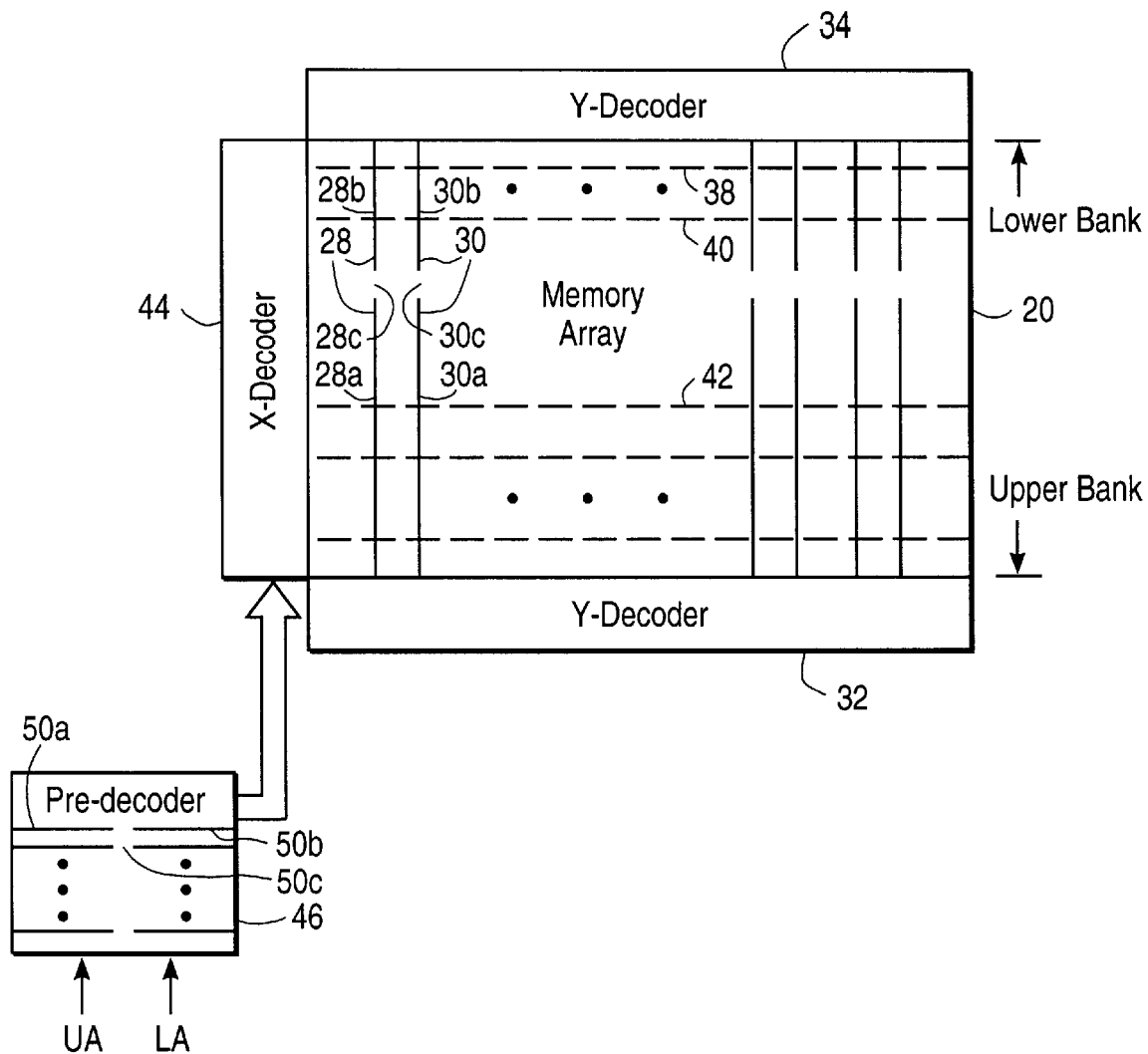
FIG. 3 is a block diagram showing another embodiment of the simultaneous operation flash memory device with a flexible bank partition architecture in accordance with the present invention.

FIG. 3 is a block diagram showing another embodiment of the simultaneous operation flash memory device with a flexible bank partition architecture according to the present invention which includes a memory array 20, first and second Y-decoders 32 and 34 coupled to the memory array 20, an X-decoder 44 coupled to the memory array 20, and a pre-decoder 46 coupled to the X-decoder 44. In this embodiment, the pre-decoder 46 is capable of receiving both upper and lower bank memory addresses UA and LA. In contrast with the X-decoder 22 as shown in FIG. 2, the X-decoder 44 in the embodiment shown in FIG. 3 is a fixed row decoder without flexibly partitioned conductive line segments.

The memory array 20, which comprises a plurality of memory cells arranged in a plurality of rows and columns, includes a plurality of flexibly partitioned bit lines including bit lines 28 and 30 as shown in FIG. 3. Each of the flexibly partitioned bit lines comprises a first bit line segment which is coupled to a respective column of memory cells allocated to the upper memory bank and a second bit line segment which is coupled to the respective column of memory cells allocated to the lower memory bank. For example, the bit line 28 comprises a first bit line segment 28a and the second bit line segment 28b separated by a gap 28c, and the bit line 30 comprises a first bit line segment 30a and a second bit line segment 30b separated by a gap 30c. The gaps between the first and second bit line segments define a memory partition boundary between the upper and lower memory banks. The gap between the first and second bit line segments can be opened at one of several predetermined locations on each of the bit lines, with each of the predetermined locations defining a respective one of a plurality of predetermined potential memory partition boundaries from which the boundary between the upper and lower memory banks is selected.

In a manner similar to the embodiment which is shown in FIG. 2 and described above, the first and second Y-decoders 32 and 34 in FIG. 3 are coupled to the first bit line segments for the upper memory bank and the second bit line segments for the lower memory bank in the memory array 20, respectively. The first Y-decoder 32 is coupled to the bit line segments in the upper memory bank for the column decoding of the memory cells disposed along the respective bit line segments in the upper memory bank. In a similar manner, the second Y-decoder 34 is coupled to the bit line segments in the lower memory bank for the column decoding of the memory cells disposed along the respective bit line segments in the lower memory bank. Furthermore, the single X-decoder 44 is coupled to all of the word lines including word lines 38, 40 and 42 in the memory array 20 for the row decoding of the memory cells disposed along the respective word lines.

In the embodiment shown in FIG. 3, the pre-decoder 46 is capable of receiving both the upper bank memory address bits UA and the lower bank memory address bits LA, and in response generating a plurality of bank address decoding bits for the X-decoder 44 to row decode the memory cells in the memory array 20. The pre-decoder 46 comprises a plurality of flexibly partitioned conductive line segments coupled to receive the upper and lower bank memory addresses UA and LA. For example, the first pre-decoder 46 includes a plurality of flexibly partitioned conductive line segments such as the conductive line segments 50a and 50b as shown in FIG. 3. Each of the flexibly partitioned conductive lines in the first pre-decoder 46 has a gap between the conductive line segments, such as gap 50c between the first and second conductive line segments 50a and 50b as shown in FIG. 3. The gaps in the flexibly partitioned conductive lines in the first pre-decoder 46 defines the memory partition boundary which is the same boundary defined by the gaps between the flexibly partitioned bit line segments in the memory array 20.

Similarly, the second pre-decoder 48 also includes a plurality of conductive line segments such as conductive line segments 52a and 52b as shown in FIG. 3. Each of the flexibly partitioned conductive lines in the pre-decoder 48 has a gap between the first and second conductive line segments, such as the gap 52c between the first and second conductive line segments 52a and 52b. The gaps between the first and second conductive line segments in the second pre-decoder 48 also defines the memory partition boundary which is the same as the boundary defined by the gaps between the first and second bit line segments in the memory array 20.

In the first pre-decoder 46, the first conductive line segments including the conductive line segment 50a are coupled to receive the upper bank memory address bits denoted as UA, whereas the second conductive line segments including the conductive line segment 50b are coupled to receive the lower bank memory address bits denoted as LA. In the second pre-decoder 48, the first conductive line segments including the conductive line segment 52a are coupled to receive the upper bank memory address bits UA, and the second conductive line segments including the conductive line segment 52b are coupled to receive the lower bank memory address bits LA. The pre-decoder 46 then transmits the respective bank address pre-decoding signals to the X-decoder 44, which provides row decoding signals to the word lines coupled to the respective rows of memory cells in the memory array 20 in response to the upper and lower bank address pre-decoding signals.

Figure 4:
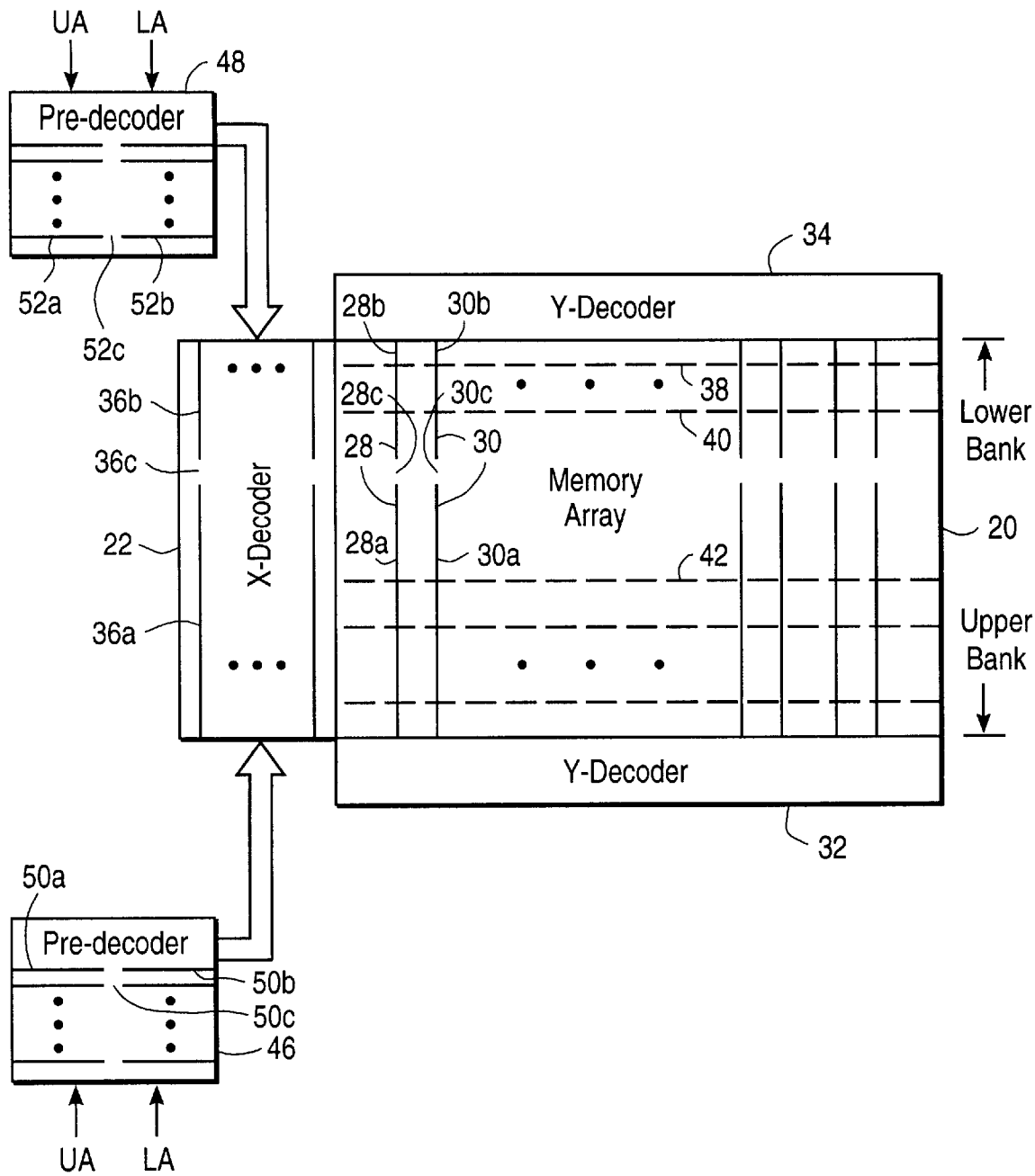
FIG. 4 is a block diagram showing yet another embodiment of the simultaneous operation flash memory device with a flexible bank partition architecture in according with the present invention.

In yet another embodiment, the simultaneous flash memory device with a flexible bank partition architecture according to the present invention comprises an X-decoder and at least one pre-decoder both having flexibly partitioned conductive line segments. FIG. 4 shows a block diagram which includes an X-decoder 22 with flexibly partitioned conductive line segments and two pre-decoders 46 and 48 which also have flexibly partitioned conductive line segments. In the X-decoder 22, the flexibly partitioned conductive line segments are separated by respective gaps designating the selected memory partition boundary. For example, the first and second conductive line segments 36a and 36b in the X-decoder 22 as shown in FIG. 4 is separated by the gap 36c. Other flexibly partitioned conductive lines in the X-decoder 22 have respective gaps at the corresponding positions to designate the selected memory partition boundary. The first and second conductive line segments in the X-decoder 22 are coupled to the memory array 20 for the row decoding of the upper and lower memory banks, respectively.

Within each of the first and second pre-decoders 46 and 48, a plurality of flexibly partitioned conductive lines are provided for the pre-decoding of a memory address which may belong to either the upper memory bank or the lower memory bank. In the first pre-decoder 46, the flexibly partitioned conductive line segments are separated by respective gaps designating the selected memory partition boundary. For example, the first and second conductive line segments 50a and 50b are broken by the gap 50c as shown in FIG. 4. Other flexibly partitioned conductive lines in the first pre-decoder 46 have respective gaps at the corresponding locations to designate the selected memory partition boundary. The first conductive line segments including the segment 50a are coupled to receive the upper bank memory address UA, whereas the second conductive line segments including the segment 50b are coupled to receive the lower bank memory address LA.

Similarly, the second pre-decoder 48 also has a plurality of flexibly partitioned conductive line segments such as the first and second conductive line segments 52a and 52b separated by the gap 52c as shown in FIG. 4. The gaps in the flexibly partitioned conductive lines in the second pre-decoder 48 are also formed at selected locations to designate the selected memory partition boundary. The first and second conductive line segments in the second pre-decoder 48, such as the conductive line segments 52a and 52b, are coupled to receive the upper and lower bank memory addresses UA and LA, respectively. Furthermore, the first pre-decoder 46 is coupled to the first conductive line segments in the X-decoder 22 for the row decoding of the upper memory bank, while the second pre-decoder 48 is coupled to the second conductive line segments in the X-decoder 22 for the row decoding of the lower memory bank.

In an embodiment according to the present invention, the simultaneous flash memory device with a flexible bank partition architecture comprises a memory array 20 which includes a plurality of memory cells arranged in a plurality of rows and columns, a plurality of bit lines such as bit lines 28 and 30 each coupled to a respective column of the memory cells, each of the bit lines comprising first and second bit line segments separated by a gap designating a memory boundary between the upper and lower memory banks, means, coupled to the memory array, for row decoding the respective rows of memory cells, and means, coupled to the memory array, for column decoding the respective columns of the memory cells.

In a further embodiment, the means for row decoding the respective rows of the memory cells comprises the X-decoder 22 with flexibly partitioned conductive line segments and the pre-decoders 24 and 26 capable of receiving the upper and lower bank memory addresses UA and LA, respectively, as shown in FIG. 2. In an alternate embodiment, the means for row decoding the respective rows of the memory cells comprises the X-decoder 44 and the pre-decoder 46 having flexibly partitioned conductive line segments capable of receiving the upper and lower bank memory addresses UA and LA as shown in FIG. 3. In an additional embodiment, the means for column decoding the respective columns of the memory cells includes the first and second Y-decoders 32 and 34 coupled to the first and second bit line segments in the upper and lower memory banks, respectively, as shown in FIGS. 2 and 3.

Figure 5:
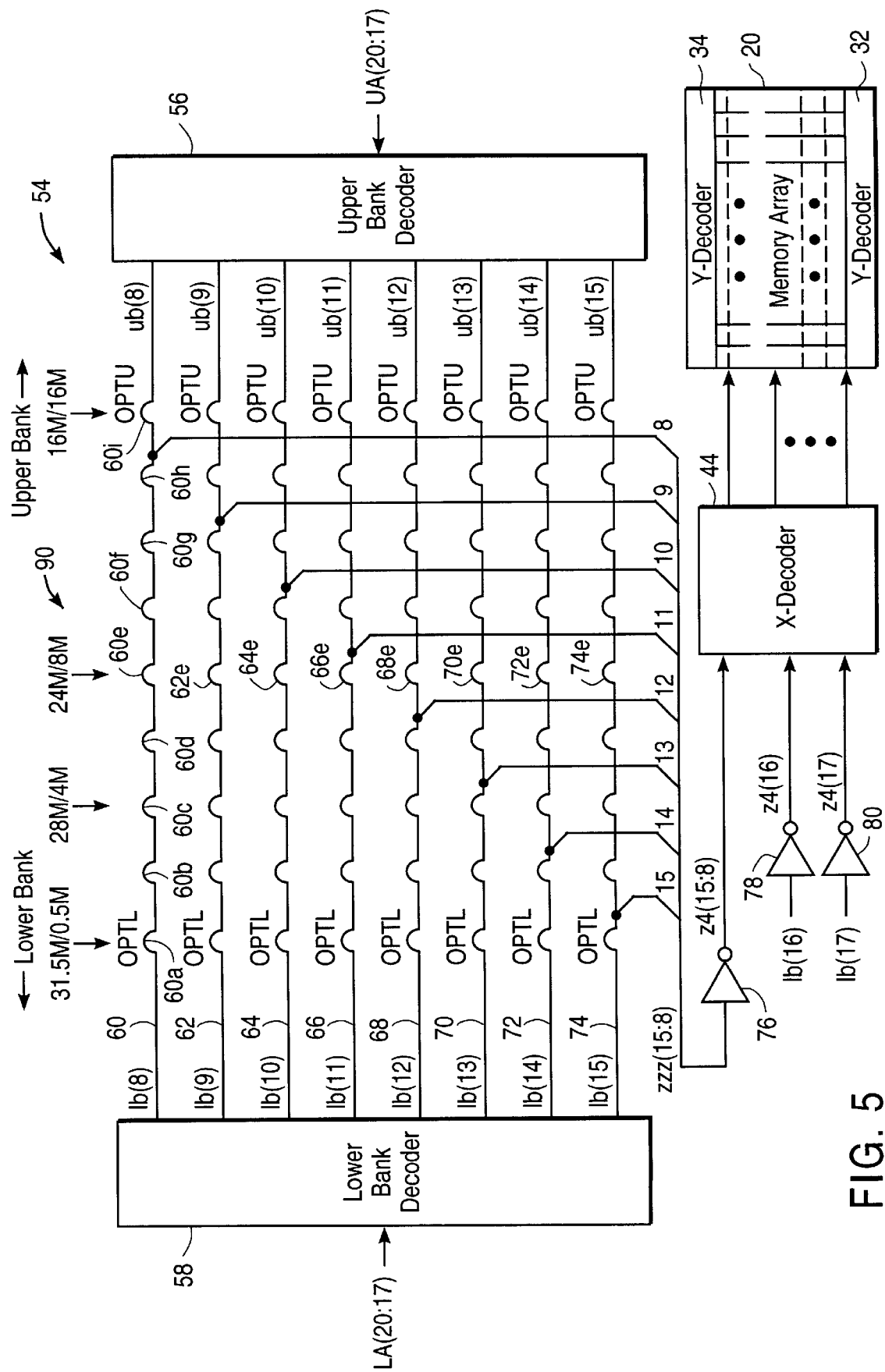
FIG. 5 is a block diagram showing an embodiment of a decoding circuit for the simultaneous flash memory device with a flexible bank partition architecture according to the present invention.

FIG. 5 shows yet another embodiment of the simultaneous operation flash memory device with a flexible bank partition architecture according to the present invention with another pre-decoding scheme for the X-decoder. In this embodiment, the means 54 for row decoding the memory cells in the memory array 20 includes a single X-decoder 44, an upper bank decoder 56, a lower bank decoder 58, and a plurality of flexibly partitioned conductive lines 60, 62, 64, 66, 68, 70, 72 and 74 positioned between the lower bank encoder 58 and the upper bank encoder 56. Each of the conductive lines has a plurality of predetermined potential gaps each corresponding to a respective one of a plurality of predetermined possible memory partition boundaries from which the boundary between the upper and lower memory banks is selected. In the example shown in FIG. 5, the conductive line 60 has nine possible memory partition boundaries 60a, 60b, 60c, . . . 60i. The other conductive lines have the same number of possible memory partition boundaries at corresponding locations. For example, when an upper bank/lower bank memory partition boundary of 24 MB/8 MB is desired, gaps 60e, 62e, 64e, . . . 74e are provided on the respective conductive lines 60, 62, 64, . . . 74 to separate the conductive lines into the respective first and second conductive line segments for the upper and lower memory banks. Other gaps along the conductive lines 60, 62, 64, . . . 74 are closed 74e are left open to define the selected upper bank/lower bank partition boundary of 24 MB/8 MB.

The bank address decoding output ZZZ(15:8), which is an 8-bit output connected to receive the respective bank address pre-decoding bits from the respective conductive lines 60, 62, 64, . . . 74, receives some of the decoding bits from the lower bank decoder 58 and other decoding bits from the upper bank decoder 56, depending upon the locations of the gaps along the respective conductive lines. For example, when the gaps are formed at the selected locations 60e, 62e, 64e, . . . 74e along the respective conductive lines 60, 62, 64, . . . 74 designating an upper bank/lower bank memory partition of 24 MB/8 MB, the higher order bits ZZZ(15:12) of the ZZZ pre-decoding output ZZZ(15:8) are generated by the lower bank decoder 58, which is connected to the conductive line segments in rows 1b(15), 1b(14), 1b(13) and 1b(12). On the other hand, the lower order bits ZZZ(11:8) of the ZZZ pre-decoding output ZZZ(15:8) are generated by the upper bank decoder 56, which is connected to the conductive line segments in rows ub(11), ub(10), ub(9) and ub(8). The bank address pre-decoding bits ZZZ(15:8) pass through an inverter 76 to generate a plurality of Z4 pre-decoding signal bits Z4(15:8), which are transmitted to the X-decoder 44.

In the example of the simultaneous operation flash memory device with a flexible bank partition architecture according to the present invention as illustrated in FIG. 1, a minimum of 0.5 MB of memory storage in rows Z4(16) and Z4(17), which include the memory blocks SS0, SS1, SS2, . . . SS7, are reserved for code storage and therefore always allocated to the lower memory bank. Referring back to FIG. 5, the X-decoder 44 may be further coupled to receive fixed bank address pre-decoding bits such as bits Z4(16) and Z4(17) for the memory blocks SS0, SS1, SS2, . . . SS7 in the embodiment of the simultaneous operation flash memory device shown in FIG. 1. The fixed lower bank decoding inputs 1b(16) and 1b(17) for the reserved lower bank memory blocks SS0, SS1, SS2, . . . SS7 are passed through inverters 78 and 80, respectively, to generate the Z4 pre-decoding signal bits Z4(16) and Z4(17), which are transmitted to the X-decoder 44. The X-decoder 44 is coupled to the word lines in the memory array 20 for the row decoding of the rows of memory cells along the respective word lines in the memory array 20. In addition to the row decoding of the flexibly partitioned rows of memory cells which can be assigned to either the upper memory bank or the lower memory bank, the X-decoder 44 also performs the row decoding of the reserved rows of memory cells, such as rows Z4(16) and Z4(17) in the lower memory bank.

In yet another embodiment, the means for row decoding comprises an X-decoder 22 with a plurality of flexibly partitioned conductive lines and at least one pre-decoder 46 with a plurality of flexibly partitioned conductive lines coupled to the X-decoder 22. As shown in FIG. 4, two pre-decoders 46 and 48 each having a plurality of flexibly partitioned conductive lines with respective gaps designating the selected memory partition boundary may be provided in the memory device according to the present invention. The X-decoder 22 has a plurality of first and second conductive line segments coupled to the first and second pre-decoders 46 and 48, respectively. The gaps in the flexibly partitioned conductive lines in the X-decoder 22 designate the selected memory partition boundary. Furthermore, the first and second conductive line segments in the X-decoder 22 are coupled to the memory array 20 for the row decoding of the upper and lower memory banks, respectively.

Furthermore, the simultaneous operation flash memory device with a flexible bank partition architecture according to the present invention includes means for column decoding the respective columns of memory cells in the memory array 20. In an embodiment, the means for column decoding the respective columns of memory cells includes first and second Y-decoders 32 and 34 coupled to the first and second bit line segments in the upper and lower memory banks, respectively. The separate Y-decoder is provided for the columns of memory cells along the respective bit lines in each of the upper and lower memory banks to provide column decoding separately. The column decoding of the memory array 20 by the first and second Y-decoders 32 and 34 as shown in FIG. 5 is performed in a manner similar to those which are shown in FIGS. 2 and 3 and described above.

FIG. 6 is a simplified plan view of a basic metal layer 2 with a plurality of basic metal layer segments 2a, 2b, 2c, . . . 2j which are formed on a semiconductor substrate 4 and serve as the basis for the fabrication of the flexibly partitioned bit line segments in the memory array as well as well as the flexibly partitioned conductive line segments in the decoding circuits as shown in FIGS. 2–4. In FIG. 6, a plurality of gaps 6a, 6b, 6c, . . . 6i are positioned between the adjacent basic metal layer segments 2a and 2b, 2b and 2c, 2c and 2d, . . . 2i and 2j, respectively. A mask pattern for the basic metal layer 2 as shown in FIG. 6 can be prepared on a computer by using a computer-aided design (CAD) technique for producing integrated circuit masks.

The basic metal layer 2 has a plurality of predetermined memory boundary options designated by the gaps 6a, 6b, 6c, . . . 6i. Each of the memory boundary options can be used to form the gap between the first and second bit line segments of each of the bit lines in the memory array or the gap between the first and second conductive line segments of each of the conductive lines in the decoding circuits to serve as the partition boundary between the upper and lower memory banks. In the case of fabricating the bit line segments in the memory array, the basic metal layer may comprise an M2 metal layer from which the bit line segments are produced.

FIG. 7 shows a simplified plan view of a metal option layer 8 comprising a plurality of metal option layer segments 8a, 8b, 8c, . . . 8h. The total number of metal option layer segments in the metal option layer 8 is one less than the total number of gaps in the basic metal layer 2. A mask pattern for the metal option layer segments 8a, 8b, 8c, . . . 8h may be prepared on a computer by using a CAD technique, and the mask patterns for the metal option layer 8 as shown in FIG. 7 and for the basic metal layer 2 as shown in FIG. 6 may be combined together by overlapping the metal option layer segments 8a, 8b, 8c, . . . 8h with the respective gaps 6a, 6b, 6c, . . . 6h but leaving the gap 6i open, to form a mask pattern for the conductive line segments 10 and 12 as shown in FIG. 8. Alternatively, two masks may be prepared for the basic metal layer and for the metal option layer separately, and the conductive line segments 10 and 12 as shown in FIG. 8 may be formed by depositing the metal option layer segments as shown in FIG. 7 on top of the respective gaps in the basic metal layer 2 as shown in FIG. 6.

FIG. 9 shows another example of the metal option layer 8 with metal option layer segments 8a, 8b, 8c, . . . 8g and 8i, such that when the mask pattern for the metal option layer 8 as shown in FIG. 9 is combined with the mask pattern for the basic metal layer 2 as shown in FIG. 6 on the computer, such that the metal option layer segments 8a, 8b, 8c, . . . 8g and 8i overlap the respective gaps 6a, 6b, 6c, . . . 6g and 6i in the basic metal layer 2, a mask pattern for conductive line segments 14 and 15 separated by the gap 6h as shown in FIG. 10 is produced. The gap 6h between the conductive line segments 14 and 16 as shown in FIG. 10 designates a memory partition boundary different from that which is designated by the gap 6i between the conductive line segments 10 and 12 as shown in FIG. 8. Therefore, the same basic metal layer pattern as shown in FIG. 6 can be used for the fabrication of the bit line segments for the upper and lower memory banks in the memory array with flexible bank partitions.

Similarly, the same basic metal layer pattern can be used for the fabrication of the flexibly partitioned conductive line segments in the decoding circuits. Only the mask pattern for the metal option layer need be changed to produce a desired gap between the bit line segments in the memory array or the conductive line segments in the decoding circuits to partition the upper and lower memory banks. For example, the bit line segments in the memory array 20 in FIGS. 2–5, the conductive line segments in the X-decoder 22 in FIGS. 2 and 4, the conductive line segments in the pre-decoders in FIG. 3 and 4, and the conductive lines 60, 62, 64 . . . 74 in FIG. 5 may be fabricated according to the method of preparing and combining the mask patterns for the basic metal layer and for the metal option layer described above.

Industrial Applicability

The simultaneous operation non-volatile memory device with a flexible bank partition architecture according to the present invention is applicable to the art of memory devices, and more particularly, to the art of simultaneous operation flash memory devices. The simultaneous operation flash memory device according to the present invention comprises two memory banks with variable memory capacities depending upon the selection of a memory partition boundary from a plurality of potential memory partition boundaries. Furthermore, a simplified decoding architecture is provided for the simultaneous operation flash memory device with flexibly partitioned memory banks according to the present invention to simplify the design of decoding circuits for the simultaneous operation flash memory device with a variety of possible memory partition boundaries.

The invention has been described with respect to particular embodiments thereof, and numerous modifications can be made which are within the scope of the invention as set forth in the claims.

What is claimed is:

1. A simultaneous operation non-volatile memory device, comprising:

(a) a memory array comprising a plurality of memory cells arranged in a plurality of rows and columns;

(b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries; and (c) an X-decoder coupled to the respective rows of the memory cells and capable of receiving upper and lower bank memory addresses.

2. The non-volatile memory device of claim 1, further comprising a first Y-decoder coupled to the first bit line segments and a second Y-decoder coupled to the second bit line segments.

3. The non-volatile memory device of claim 1, further comprising a pre-decoder, coupled to the X-decoder, comprising a plurality of flexibly partitioned conductive lines, each of the conductive lines comprising first and second conductive line segments separated by a gap designating the selected memory partition boundary, the first conductive line segments capable of receiving the upper bank memory address and the second conductive line segments capable of receiving the lower bank memory address.

4. The non-volatile memory device of claim 3, wherein the flexibly partitioned conductive lines in the pre-decoder are fabricated from a metal layer having a plurality of predetermined memory boundary options corresponding to the predetermined partition boundaries, each of the memory boundary options capable of forming the gap which separates the first and second conductive line segments.

5. The non-volatile memory device of claim 4, wherein the first and second conductive line segments in the pre-decoder are formed by electrically closing the memory boundary options along each of the conductive lines but leaving one of the memory boundary options open, to form the gap between the first and second conductive line segments.

6. The non-volatile memory device of claim 1, wherein the X-decoder comprises a plurality of flexibly partitioned conductive lines, each of the conductive lines comprising first and second conductive line segments separated by a gap designating the selected memory partition boundary.

7. The non-volatile memory device of claim 6, wherein the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments.

8. The non-volatile memory device of claim 7, wherein the first and second conductive line segments in the X-decoder are formed by electrically closing the memory boundary options along each of the conductive lines but leaving one of the memory boundary options open, to form the gap between the first and second conductive line segments.

9. The non-volatile memory device of claim 6, further comprising first and second pre-decoders coupled to the first and second conductive line segments in the X-decoder, respectively, the first pre-decoder capable of receiving the upper bank memory address and the second pre-decoder capable of receiving the lower bank memory address.

10. The non-volatile memory device of claim 9, wherein the first and second pre-decoders each comprise a plurality of flexibly partitioned conductive lines, each of the conductive lines comprising first and second conductive line segments separated by a gap designating the selected memory partition boundary, the first and second conductive line segments in the pre-decoders capable of receiving the upper and lower bank memory addresses, respectively.

11. The non-volatile memory device of claim 1, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

12. The non-volatile memory device of claim 11, wherein the first and second bit line segments are formed by electrically closing the memory boundary options along each of the bit lines but leaving one of the memory boundary options open, to form the gap between the first and second bit line segments.

13. A simultaneous operation non-volatile memory device, comprising:

(a) a memory array comprising a plurality of memory cells arranged in a plurality of rows and columns;

(b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries;

(c) first and second Y-decoders coupled to the first and second bit line segments in the memory array, respectively; and (d) an X-decoder coupled to the respective rows of the memory cells and capable of receiving upper and lower bank memory addresses.

14. The non-volatile memory device of claim 13, further comprising a pre-decoder, coupled to the X-decoder, comprising a plurality of flexibly partitioned conductive lines, each of the conductive lines comprising first and second conductive line segments separated by a gap designating the selected memory partition boundary, the first conductive line segments capable of receiving the upper bank memory address and the second conductive line segments capable of receiving the lower bank memory address.

15. The non-volatile memory device of claim 14, wherein the flexibly partitioned conductive lines in the pre-decoder are fabricated from a metal layer having a plurality of predetermined memory boundary options corresponding to the predetermined partition boundaries, each of the memory boundary options capable of forming the gap which separates the first and second conductive line segments.

16. The non-volatile memory device of claim 15, wherein the first and second conductive line segments in the pre-decoder are formed by electrically closing the memory boundary options along each of the conductive lines but leaving one of the memory boundary options open, to form the gap between the first and second conductive line segments.

17. The non-volatile memory device of claim 13, wherein the X-decoder comprises a plurality of flexibly partitioned conductive lines, each of the conductive lines comprising first and second conductive line segments separated by a gap designating the selected memory partition boundary.

18. The non-volatile memory device of claim 17, wherein the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments.

19. The non-volatile memory device of claim 18, wherein the first and second conductive line segments in the X-decoder are formed by electrically closing the memory boundary options along each of the conductive lines but leaving one of the memory boundary options open, to form the gap between the first and second conductive line segments.

20. The non-volatile memory device of claim 17, further comprising first and second pre-decoders coupled to the first and second conductive line segments in the X-decoder, respectively, the first pre-decoder capable of receiving the upper bank memory address and the second pre-decoder capable of receiving the lower bank memory address.

21. The non-volatile memory device of claim 20, wherein the first and second pre-decoders each comprise a plurality of flexibly partitioned conductive lines, each of the conductive lines comprising first and second conductive line segments separated by a gap designating the selected memory partition boundary, the first and second conductive line segments in the pre-decoders capable of receiving the upper and lower bank memory addresses, respectively.

22. The non-volatile memory device of claim 13, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

23. The non-volatile memory device of claim 22, wherein the first and second bit line segments are formed by electrically closing the memory boundary options along each of the bit lines but leaving one of the memory boundary options open, to form the gap between the first and second bit line segments.

24. A simultaneous operation non-volatile memory device, comprising:
    (a) a memory array comprising a plurality of memory cells arranged in a plurality of rows and columns;
    (b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries;
    (c) an X-decoder coupled to the respective rows of the memory cells; and
    (d) a pre-decoder, coupled to the X-decoder, comprising a plurality of flexibly partitioned conductive lines, each of the conductive lines comprising first and second conductive line segments separated by a gap designating the selected memory partition boundary, the first conductive line segments capable of receiving an upper bank memory address and the second conductive line segments capable of receiving a lower bank memory address.

25. The non-volatile memory device of claim 24, further comprising a first Y-decoder coupled to the first bit line segments and a second Y-decoder coupled to the second bit line segments.

26. The non-volatile memory device of claim 24, wherein the flexibly partitioned conductive lines in the pre-decoder are fabricated from a metal layer having a plurality of predetermined memory boundary options corresponding to the predetermined partition boundaries, each of the memory boundary options capable of forming the gap which separates the first and second conductive line segments.

27. The non-volatile memory device of claim 26, wherein the first and second conductive line segments in the pre-decoder are formed by electrically closing the memory boundary options along each of the conductive lines but leaving one of the memory boundary options open, to form the gap between the first and second conductive line segments.

28. The non-volatile memory device of claim 24, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

29. The non-volatile memory device of claim 28, wherein the first and second bit line segments are formed by electrically closing the memory boundary options along each of the bit lines but leaving one of the memory boundary options open, to form the gap between the first and second bit line segments.

30. A simultaneous operation non-volatile memory device, comprising:
    (a) a memory array comprising a plurality of memory cells arranged in a plurality of rows and columns;
    (b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries;
    (c) an X-decoder, coupled to the respective rows of the memory cells, comprising a plurality of flexibly partitioned conductive lines, each of the conductive lines comprising first and second conductive line segments separated by a gap designating the selected memory partition boundary; and
    (d) first and second pre-decoders coupled to the first and second conductive line segments in the X-decoder, respectively, the first pre-decoder capable of receiving an upper bank memory address and the second pre-decoder capable of receiving a lower bank memory address.

31. The non-volatile memory device of claim 30, further comprising a first Y-decoder coupled to the first bit line segments and a second Y-decoder coupled to the second bit line segments.

32. The non-volatile memory device of claim 30, wherein the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments.

33. The non-volatile memory device of claim 32, wherein the first and second conductive line segments in the X-decoder are formed by electrically closing the memory boundary options along each of the conductive lines but leaving one of the memory boundary options open, to form the gap between the first and second conductive line segments.

34. The non-volatile memory device of claim 30, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

35. The non-volatile memory device of claim 34, wherein the first and second bit line segments are formed by electrically closing the memory boundary options along each of the bit lines but leaving one of the memory boundary options open, to form the gap between the first and second bit line segments.

36. The non-volatile memory device of claim 30, wherein the first and second pre-decoders each comprise a plurality of flexibly partitioned conductive lines, each of the conductive lines comprising first and second conductive line segments separated by a gap designating the selected memory partition boundary, the first and second conductive line segments in the pre-decoders capable of receiving the upper and lower bank memory addresses, respectively.

37. A simultaneous operation non-volatile memory device, comprising:

(a) a memory array comprising a plurality of memory cells arranged in a plurality of rows and columns;

(b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries;

(c) means, coupled to the memory array, for row decoding the respective rows of the memory cells; and (d) means, coupled to the memory array, for column decoding the respective columns of the memory cells.

38. The non-volatile memory device of claim 37, wherein the means for column decoding comprises a first Y-decoder coupled to the first bit line segments and a second Y-decoder coupled to the second bit line segments.

39. The non-volatile memory device of claim 37, wherein the means for row decoding comprises an X-decoder coupled to the respective rows of the memory cells and capable of receiving upper and lower bank memory addresses.

40. The non-volatile memory device of claim 39, wherein the means for row decoding further comprises a pre-decoder, coupled to the X-decoder, comprising a plurality of flexibly partitioned conductive lines, each of the conductive lines comprising first and second conductive line segments separated by a gap designating the selected memory partition boundary, the first conductive line segments capable of receiving the upper bank memory address and the second conductive line segments capable of receiving the lower bank memory address.

41. The non-volatile memory device of claim 40, wherein the flexibly partitioned conductive lines in the pre-decoder are fabricated from a metal layer having a plurality of predetermined memory boundary options corresponding to the predetermined partition boundaries, each of the memory boundary options capable of forming the gap which separates the first and second conductive line segments.

42. The non-volatile memory device of claim 41, wherein the first and second conductive line segments in the pre-decoder are formed by electrically closing the memory boundary options along each of the conductive lines but leaving one of the memory boundary options open, to form the gap between the first and second conductive line segments.

43. The non-volatile memory device of claim 39, wherein the X-decoder comprises a plurality of flexibly partitioned conductive lines, each of the conductive lines comprising first and second conductive line segments separated by a gap designating the selected memory partition boundary.

44. The non-volatile memory device of claim 43, wherein the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments.

45. The non-volatile memory device of claim 44, wherein the first and second conductive line segments in the X-decoder are formed by electrically closing the memory boundary options along each of the conductive lines but leaving one of the memory boundary options open, to form the gap between the first and second conductive line segments.

46. The non-volatile memory device of claim 43, wherein the means for row decoding further comprises first and second pre-decoders coupled to the first and second conductive line segments in the X-decoder, respectively, the first pre-decoder capable of receiving the upper bank memory address and the second pre-decoder capable of receiving the lower bank memory address.

47. The non-volatile memory device of claim 37, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

48. The non-volatile memory device of claim 47, wherein the first and second bit line segments are formed by electrically closing the memory boundary options along each of the bit lines but leaving one of the memory boundary options open, to form the gap between the first and second bit line segments.

49. A simultaneous operation non-volatile memory device, comprising:

(a) a memory array comprising a plurality of memory cells arranged in a plurality of rows and columns;

(b) a plurality of flexibly partitioned bit lines each coupled to a respective one of the columns of the memory cells, each of the bit lines comprising first and second bit line segments separated by a gap designating a memory partition boundary between upper and lower memory banks, the memory partition boundary selected from a plurality of predetermined partition boundaries;

(c) an X-decoder, coupled to the respective rows of the memory cells, comprising a plurality of flexibly partitioned conductive lines, each of the conductive lines comprising first and second conductive line segments separated by a gap designating the selected memory partition boundary; and (d) at least one pre-decoder, coupled to the X-decoder, comprising a plurality of flexibly partitioned conductive lines, each of the conductive lines comprising first and second conductive line segments separated by a gap designating the selected memory partition boundary, the first and second conductive line segments in the pre-decoder capable of receiving upper and lower bank memory addresses, respectively.

50. The non-volatile memory device of claim 49, further comprising a first Y-decoder coupled to the first bit line segments and a second Y-decoder coupled to the second bit line segments.

51. The non-volatile memory device of claim 49, further comprising an additional pre-decoder, coupled to the X-decoder, comprising a plurality of flexibly partitioned conductive lines, each of the conductive lines comprising first and second conductive line segments separated by a gap designating the selected memory partition boundary, the first and second conductive line segments in the additional pre-decoder capable of receiving the upper and lower bank memory addresses, respectively.

52. The non-volatile memory device of claim 51, wherein the two pre-decoders are coupled to the first and second conductive line segments in the X-decoder, respectively.

53. The non-volatile memory device of claim 49, wherein the flexibly partitioned conductive lines in the pre-decoder are fabricated from a metal layer having a plurality of predetermined memory boundary options corresponding to the predetermined partition boundaries, each of the memory boundary options capable of forming the gap which separates the first and second conductive line segments.

54. The non-volatile memory device of claim 53, wherein the first and second conductive line segments in the pre-decoder are formed by electrically closing the memory boundary options along each of the conductive lines but leaving one of the memory boundary options open, to form the gap between the first and second conductive line segments.

55. The non-volatile memory device of claim 49, wherein the flexibly partitioned conductive lines in the X-decoder are fabricated from a metal layer having a plurality of predetermined memory boundary options corresponding to the predetermined partition boundaries, each of the memory boundary options capable of forming the gap which separates the first and second conductive line segments.

56. The non-volatile memory device of claim 55, wherein the first and second conductive line segments in the X-decoder are formed by electrically closing the memory boundary options along each of the conductive lines but leaving one of the memory boundary options open, to form the gap between the first and second conductive line segments.

57. The non-volatile memory device of claim 49, wherein the flexibly partitioned bit lines are fabricated from a metal layer having a plurality of predetermined memory boundary options corresponding to the predetermined partition boundaries, each of the memory boundary options capable of forming the gap which separates the upper memory bank from the lower memory bank.

58. The non-volatile memory device of claim 57, wherein the first and second bit line segments are formed by electrically closing the memory boundary options along each of the bit lines but leaving one of the memory boundary options open, to form the gap between the first and second bit line segments.

* * * * *